(12) United States Patent
Kim et al.

(10) Patent No.: US 7,173,757 B2
(45) Date of Patent: Feb. 6, 2007

(54) BROAD-BAND LIGHT SOURCE USING A SEMICONDUCTOR OPTICAL AMPLIFIER

(75) Inventors: Seung-Woo Kim, Seoul (KR); Jeong-Seok Lee, Anyang-si (KR); Seong-Taek Hwang, Pyeongtaek-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 142 days.

(21) Appl. No.: 10/806,549

(22) Filed: Mar. 23, 2004

(65) Prior Publication Data

US 2005/0078359 A1 Apr. 14, 2005

(30) Foreign Application Priority Data

Oct. 13, 2003 (KR) .................. 10-2003-0071001

(51) Int. Cl.
H01S 5/00 (2006.01)
H01S 3/00 (2006.01)
(52) U.S. Cl. ............ 359/344; 372/43.01; 372/44.01; 372/45.01
(58) Field of Classification Search .......... 359/344, 359/347; 372/43.01, 44.01, 45.01
See application file for complete search history.

(56) References Cited

U.S. PATENT DOCUMENTS

| 4,747,650 | A  | * | 5/1988 | Sakuda .................. 385/27 |
| 5,103,455 | A  | * | 4/1992 | Eichen et al. ............ 372/50.22 |
| 5,295,016 | A  | * | 3/1994 | Van Deventer ............. 359/347 |
| 5,488,507 | A  | * | 1/1996 | Nishimura .................. 359/344 |
| 5,521,754 | A  | * | 5/1996 | Nitta et al. ................. 359/344 |
| 5,555,127 | A  | * | 9/1996 | Abdelkader et al. ...... 359/341.1 |
| 6,347,104 | B1 | * | 2/2002 | Dijaili et al. ............. 372/38.01 |
| 6,549,329 | B2 | * | 4/2003 | Vail et al. .................... 359/334 |
| 6,661,819 | B1 | * | 12/2003 | Ventrudo et al. ............. 372/32 |
| 2003/0067676 | A1 | * | 4/2003 | Wang et al. ................ 359/344 |
| 2005/0105171 | A1 | * | 5/2005 | Shin et al. ................. 359/344 |
| 2005/0185262 | A1 | * | 8/2005 | Yun et al. .................... 359/344 |

OTHER PUBLICATIONS

Tiemeijer, L. F., et al. "High-Gain 1310-nm Reflective Semiconductor Optical Amplifiers with Low-Gain Uncertainty", IEEE Photonics Technology Letters, vol. 9, No. 1, (Jan. 1997), pp. 37-39.*

* cited by examiner

Primary Examiner—Jack Keith
Assistant Examiner—Eric Bolda
(74) Attorney, Agent, or Firm—Cha & Reiter, L.L.C.

(57) ABSTRACT

A broad-band light source using a semiconductor optical amplifier is provided. The broad-band light source includes the semiconductor optical amplifier including an active layer serving as a gain area, an under-cladding layer, an over-cladding layer, and antireflection layers formed at both ends of the active layer; and a reflector, located at the outside of the semiconductor optical amplifier, for reflecting light outputted from the semiconductor optical amplifier so that the reflected light is inputted back to the active layer so as to minimize gain ripple of the semiconductor optical amplifier.

12 Claims, 5 Drawing Sheets

BROAD-BAND LIGHT SOURCE USING A SEMICONDUCTOR OPTICAL AMPLIFIER

CLAIM OF PRIORITY

This application claims priority to an application entitled "BROAD-BAND LIGHT SOURCE USING A SEMICONDUCTOR OPTICAL AMPLIFIER," filed in the Korean Intellectual Property Office on Oct. 13, 2003 and assigned Serial No. 2003-71001, the contents of which are hereby incorporated herein by reference.

BACKGROUND OF THE INVENTION

1. Field of the Invention

The present invention relates to a broad-band light source utilizing a semiconductor optical amplifier.

2. Description of the Related Art

Generally, broad-band light sources include a light emitting diode (LED), a super-luminescent diode (SLED), erbium-doped fiber amplifier (EDFA), etc. In particular, the EDFA widely used since it is capable of obtaining the polarization insensitive light of a high power stably. However, since a wavelength range of the light emitted from the EDFA is limited, the EDFA has a limited use as a broad-band light source. Further, the EDFA is larger than most semiconductor devices available, thus it is difficult to reduce the production cost of the EDFA through a mass-production. Accordingly, there is a need for remedy about these problems associated with the EDFA.

Recently, as broad-band light sources are widely used in the wavelength division multiplex (WDM) passive optical network (PON) field, a semiconductor optical amplifier (SOA) cheaper than other conventional optical devices is gaining its popularity as a broad-band light source.

The semiconductor optical amplifier (SOA) can be used as both an amplifier and an optical element in an optical switch, a wavelength converter, an all-optical logic circuit, a signal reproducer, and transmitter/receiver. As such, the SOA has various structures according to its application.

FIG. 1 is a schematic view of a conventional traveling semiconductor optical amplifier (SOA) 100 having a function of amplifying the light inputted through an input terminal and then outputting the amplified light through an output terminal. The traveling SOA 100 comprises an active layer 101 serving as a gain area, an under-cladding and over-cladding layers 102 and 103 formed on the lower and upper surfaces of the active layer for limiting an optical route into the active layer 101, and antireflection (AR) coating layers 104 and 105 having reflectivities of $R_1$ and $R_2$, respectively. Arrows in FIG. 1 represent an amplified spontaneous emission (ASE) of light.

In order to use the SOA as a broad-band light source, it is desirable to use a reflective SOA, of which light is inputted to and outputted from one surface so as to generate the amplified spontaneous emission (ASE) of light.

FIG. 2 is a schematic view of a conventional reflective semiconductor optical amplifier (SOA) 200. The reflective SOA 200 comprises an active layer 201 serving as a gain area, an under-cladding layer 202, an over-cladding layer 203, an AR coating layer 204 having reflectivity of $R_3$, and a high reflection coating layer 205 having reflectivity of $R_4$. The reflective SOA 200 differs from the traveling SOA 100 shown in FIG. 1 in that the AR coating layer 204 is formed at one surface of the active layer 201 of the reflective SOA 200, and the high reflection coating layer 205 is formed at the other surface of the active layer 201 of the reflective SOA 200. As such, in the reflective SOA 200, light inputted through one surface of the active layer 201 is not outputted through the other surface of the active layer 201, but reflected and amplified by the active layer 201 one more time and then outputted through the input terminal.

In order to maintain a low gain ripple, it is required to drop the reflectivity of the AR coating layer 204 of the conventional reflective SOA 200. FIG. 3 is a graph illustrating the variation in the gain ripple according to the variations in the gain and the reflectivity of a cross section of the amplifier. It is noted that in order to obtain a gain ripple of not more than 10% (0.5 dB) at a high gain, a low reflectivity must be maintained. For example, in case that the amplifier has a gain (5) of 30 dB, multiplication of the reflectivities $R_3$ and $R_4$ at both surfaces of the amplifier must not be more than $1 \times 10^{-8}$ to obtain the gain ripple of less than 0.5 dB. Accordingly, if it is assumed that the reflectivity of the high reflection coating layer is more than 30%, it can be concluded that the reflectivity at the output terminal must not be more than $1 \times 10^{-8}$. However, since the reflectivity obtained through a general process of manufacturing a semiconductor optical amplifier using the angled structures of a waveguide, a window, and antireflection coating layers being approximately $1 \times 10^{-5}$, the gain ripple is considerably high, as shown in FIG. 4. As a result, when the amplifier is operated in the area of a very low gain, the amplifier can obtain low gain ripple characteristics easily. However, in order to obtain low gain ripple characteristics in an area of high gain, the reflectivity of the output terminal of the amplifier must be lowered drastically.

SUMMARY OF THE INVENTION

Therefore, the present invention has been made in view of the above problems and provides additional advantages, by providing a broad-band light source using a semiconductor optical amplifier, which maintains low gain ripple even at an area of high gain without a decrease in the reflectivity of an output terminal.

In accordance with the present invention, a broad-band light source includes a semiconductor optical amplifier having an active layer serving as a gain area, an under-cladding layer, an over-cladding layer, and antireflection layers formed at both ends of the active layer; and a reflector located at the outside of the semiconductor optical amplifier for reflecting the light outputted from the semiconductor optical amplifier so that the reflected light is inputted again to the active layer so as to minimize the gain ripple of the semiconductor optical amplifier.

Preferably, the broad-band light source may further comprise an optical waveguide for achieving an optical coupling between the semiconductor optical amplifier and the reflector, and the optical waveguide may have a length over several times as long as the coherent length of an amplified spontaneous emission of the light from the semiconductor optical amplifier.

Further, the broad-band light source may further comprise a polarization controller for controlling the polarization dependence of the semiconductor optical amplifier.

BRIEF DESCRIPTION OF THE DRAWINGS

The above features and other advantages of the present invention will be more clearly understood from the following detailed description taken in conjunction with the accompanying drawings, in which.

DETAILED DESCRIPTION OF THE INVENTION

Figure 1:
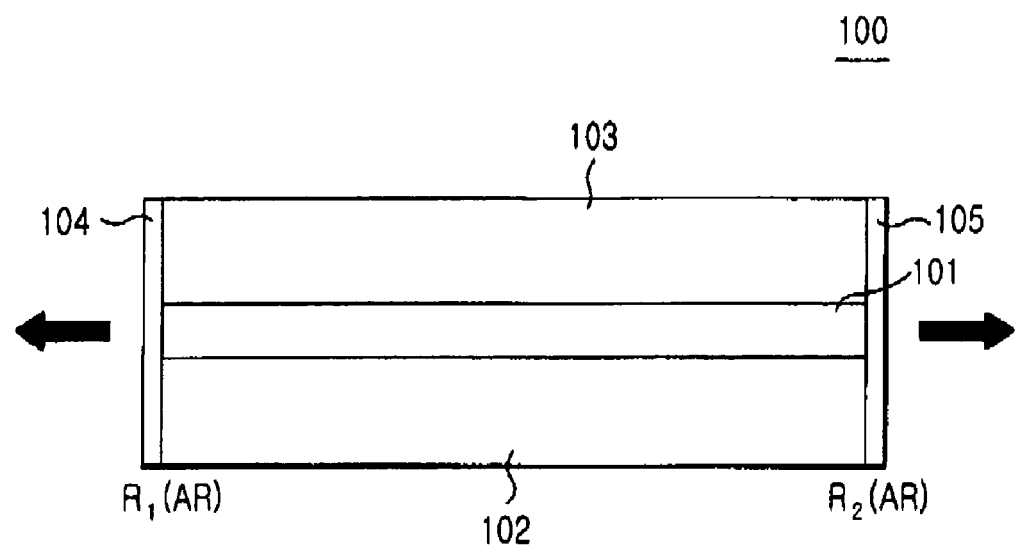
FIG. 1 is a schematic view of a conventional traveling semiconductor optical amplifier.
Figure 2:
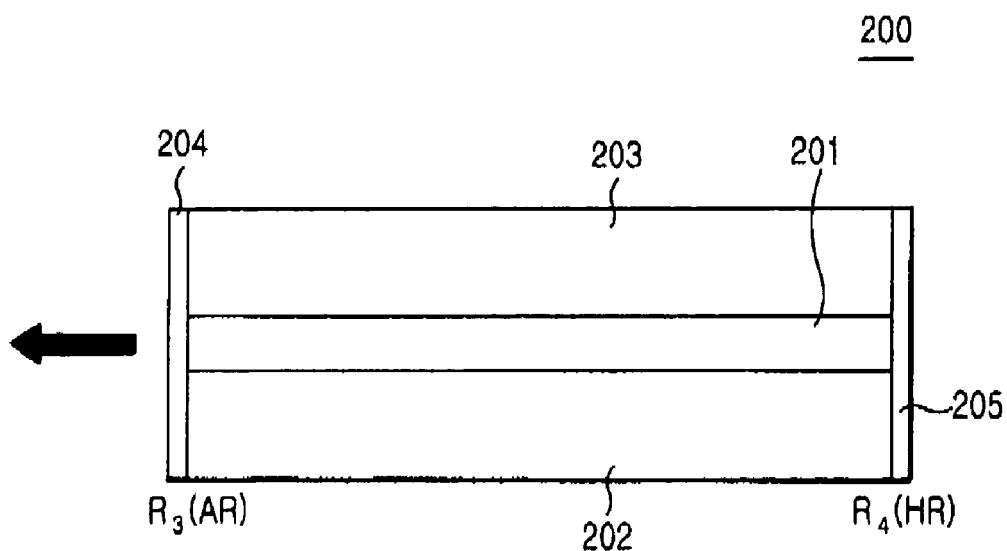
FIG. 2 is a schematic view of a conventional reflective semiconductor optical amplifier.
Figure 3:
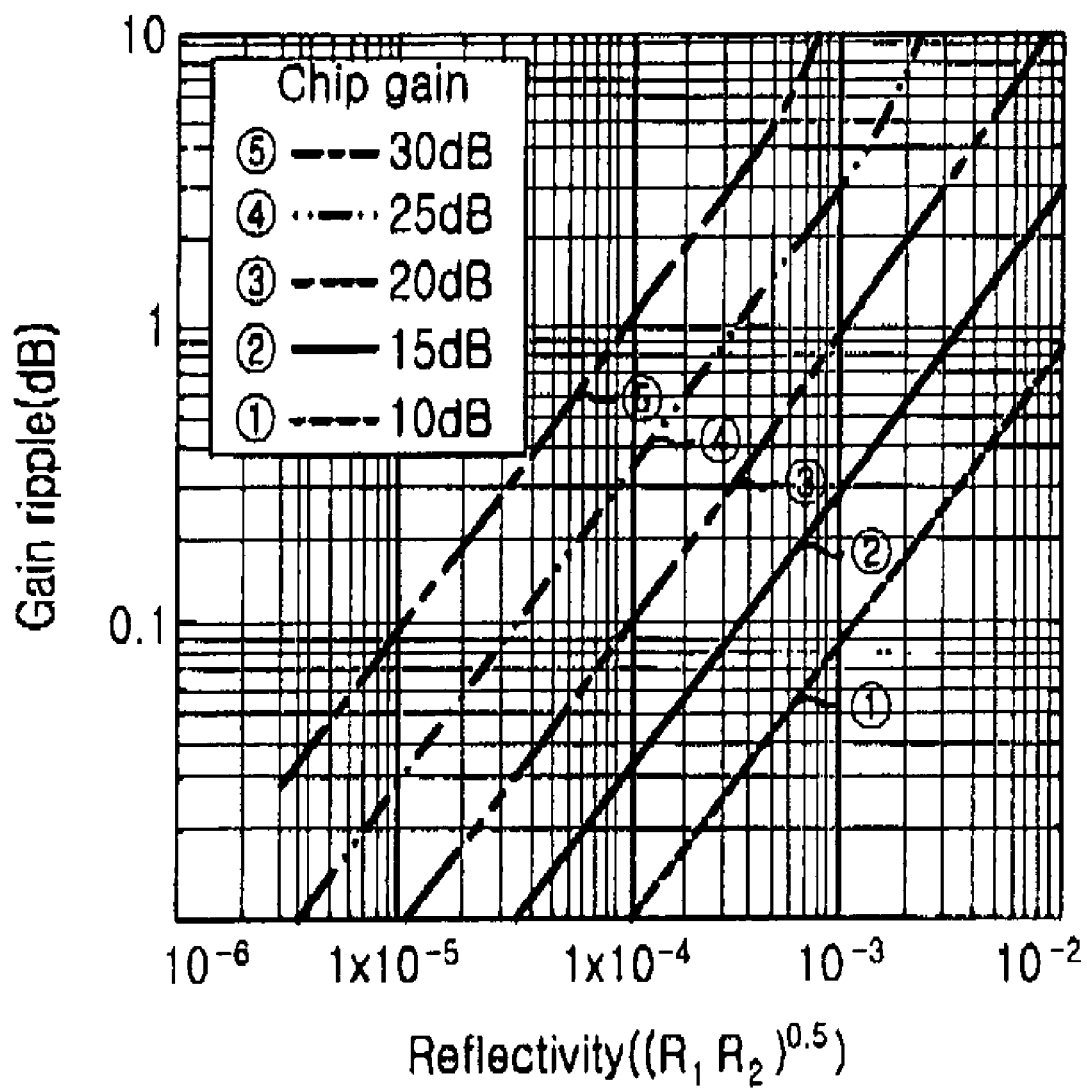
FIG. 3 is a graph illustrating the variation in the gain ripple according to the variations in the gain and the reflectivity of a cross section of the amplifier.
Figure 4:
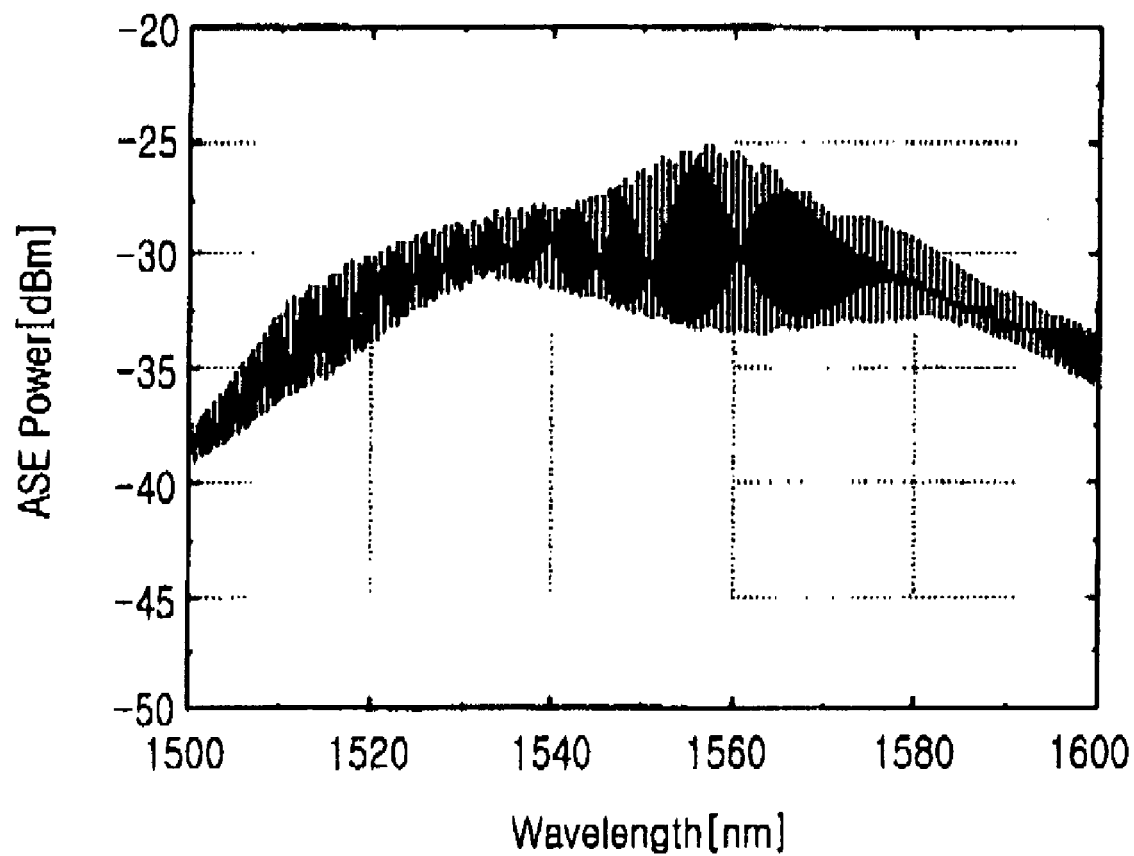
FIG. 4 is a graph illustrating the spectrum of the reflective semiconductor optical amplifier, of which the reflectivity of a cross section is not lowered.

Now, preferred embodiments of the present invention will be described in detail with reference to the annexed drawings. In the drawings, the same or similar elements are denoted by the same reference numerals even though they are depicted in different drawings. For the purposes of clarity and simplicity, a detailed description of known functions and configurations incorporated herein will be omitted as it may make the subject matter of the present invention unclear.

Figure 5:
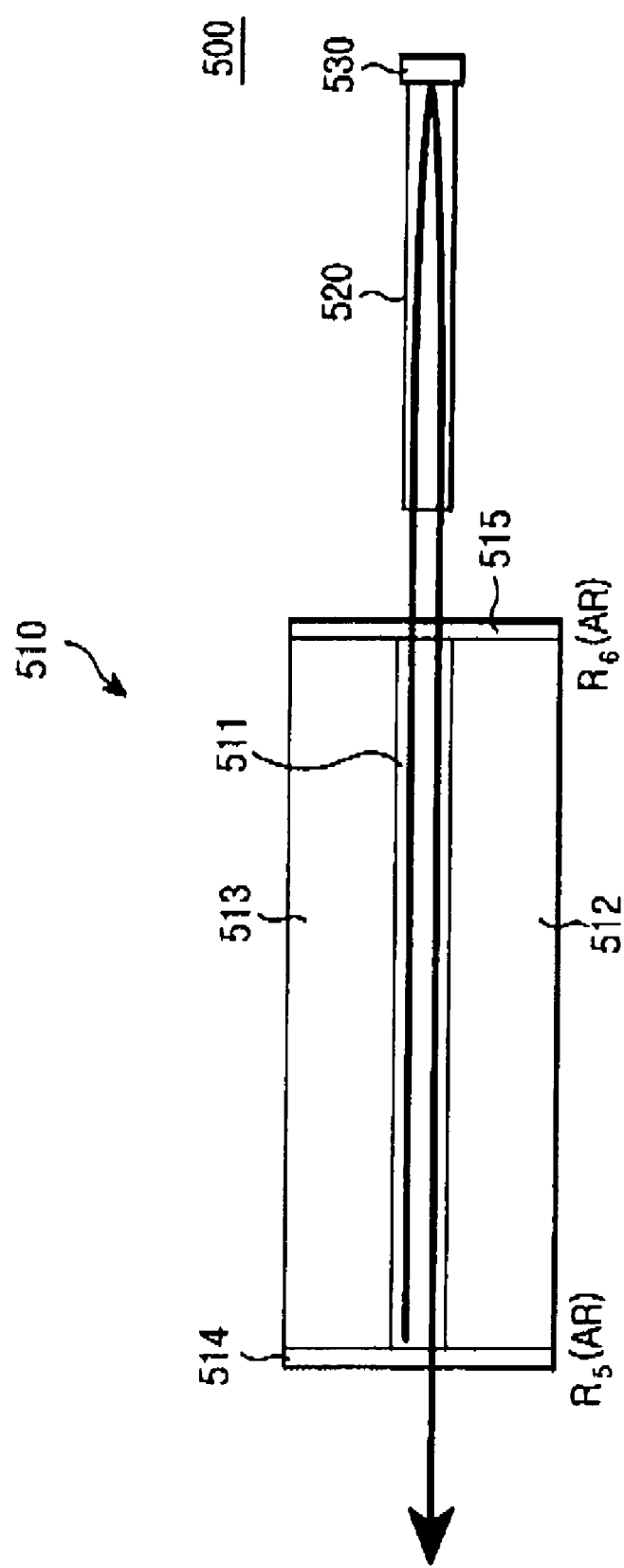
FIG. 5 is a schematic view of a broad-band light source using a semiconductor optical amplifier in accordance with one embodiment of the present invention.

FIG. 5 is a schematic view of a broad-band light source using a semiconductor optical amplifier in accordance with one embodiment of the present invention.

As shown in FIG. 5, the broad-band light source 500 includes a semiconductor optical amplifier 510, a broad-band reflector 530 for reflecting light outputted from one end of the semiconductor optical amplifier 510, and an optical waveguide 520 for achieving an optical coupling between the semiconductor optical amplifier 510 and the broad-band reflector 530.

The optical amplifier 510 further includes an active layer 511 serving as a gain area, an under-cladding and over-cladding layers 512 and 513 formed on the lower and the upper surfaces of the active layer 511 for limiting an optical route into the active layer 511, and antireflection (AR) coating layers 514 and 515 having reflectivities of $R_5$ and $R_6$ respectively.

The broad-band reflector 530 functions as a high reflection coating layer, and the reflectivity of the broad-band reflector 530 can be chosen according to the specifications required to respective applications of the broad-band light source. In general, as the reflectivity of the broad-band reflector 530 increases, the intensified output power, low gain ripple, a red shifted center wavelength can be obtained and full-width half maximum (FWHM) from AR coating layer 514 can be reduced. In addition, the semiconductor optical amplifier 510 having low optical confinement factor is more sensitive to the reflectivity of the broad-band reflector 530 than the semiconductor optical amplifier 510 having high optical confinement factor. The optical confinement factor is determined by the structure of the active layer 511 of the semiconductor optical amplifier 510. Since the reflectivity obtained through a general process of manufacturing a semiconductor optical amplifier using the angled structures of a waveguide, a window, and antireflection coating layers being approximately $1\times10^{-5}$, it is preferable that the broad-band reflector 530 has a reflectivity larger than the reflectivity of the input or output terminal of the amplifier, $1\times10^{-5}$.

Now, the operation of the above-described broad-band light source 500 in accordance with one embodiment of the present invention will be described in detail.

Referring back to FIG. 5, a portion of the ASE of light amplified by the active layer 511 is reflected by the AR coating layer 515 having reflectivity of $R_6$, and the remainder of the ASE of light is outputted. The outputted light reaches the optical waveguide 520 and is reflected by the broad-band reflector 530, thereafter. The reflected light is inputted back to the active layer 511 of the semiconductor optical amplifier 510 through the AR coating layer 515, amplified by the semiconductor optical amplifier 510, and outputted through the AR coating layer 514. In the present invention, the high reflection coating layer for reflecting the output light is located outside of the semiconductor optical amplifier. The high reflection coating layer being outside of the semiconductor optical amplifier contributes to lowering of the gain ripple. The gain ripple is caused by a Fabry-Perot mode generated due to the coherence of light, generated by injecting external current, between both ends of the active layer of the semiconductor optical amplifier. If the reflector is located outside of the semiconductor optical amplifier, as in the present invention, the light loses its coherence when light is amplified by the active layer and reaches the reflector through the waveguide. The gain ripple is minimized; although some gain ripple is generated by the reflectivity, having a value above zero, at both ends of the semiconductor optical amplifier. Note that the length of the waveguide is several times the length of a coherence length of the ASE of light amplified by the semiconductor optical amplifier (for example, 10 mm or more).

Figure 6:
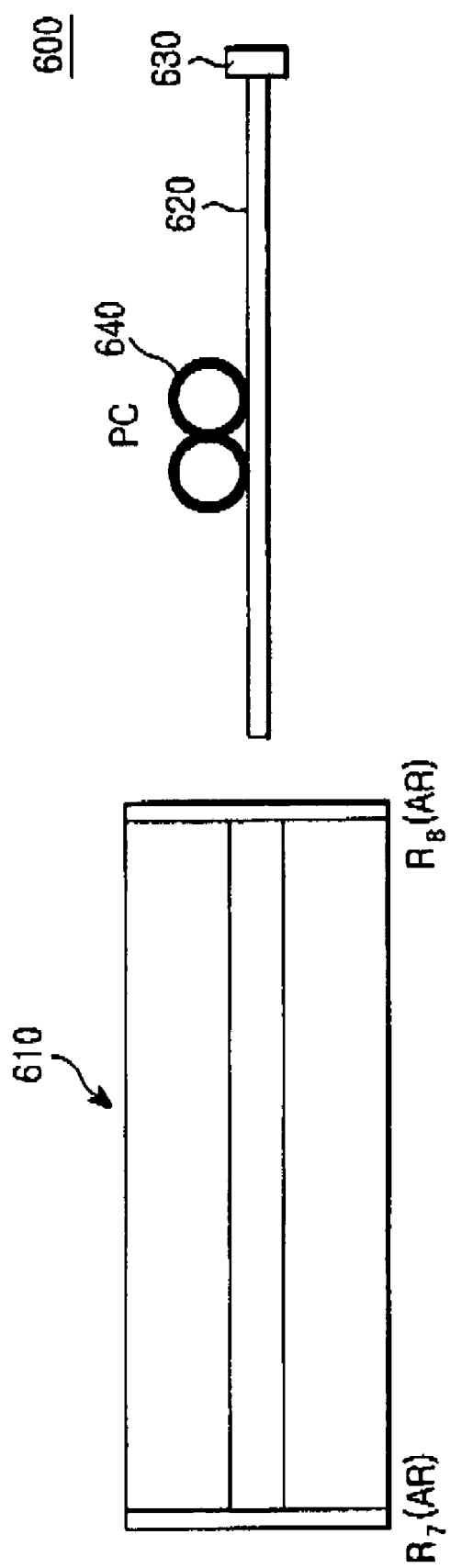
FIG. 6 is a schematic view of a broad-band light source using a semiconductor optical amplifier in accordance with another embodiment of the present invention.

FIG. 6 is a schematic view of a broad-band light source 600 using a semiconductor optical amplifier in accordance with another embodiment of the present invention. The broad-band light source 600 includes a semiconductor optical amplifier 610, a broad-band reflector 630 for reflecting the light outputted from one end of the semiconductor optical amplifier 610, and an optical waveguide 620 for achieving an optical coupling between the semiconductor optical amplifier 610 and the broad-band reflector 630. The broad-band light source 600 further comprises a polarization controller 640 located on the optical waveguide 620 between the semiconductor optical amplifier 610 and the broad-band reflector 630.

The construction and operation of the second embodiment are essentially the same as that described in FIG. 5. However, in FIG. 6, the broad-band light source 600 is provided with a polarization controller 640 that controls the polarization dependence of the semiconductor optical amplifier 610. Thus, the discussion of the broad-band light source 600 is limited to that related to the polarization controller 640 ant its application with respect to the broad-band light source. Although the semiconductor optical amplifier 610 has the polarization dependence, the polarization controller 640 serves to eliminate the polarization dependence at the output end thereof.

As apparent from the above description, the present invention provides a broad-band light source using a semiconductor optical amplifier, in which a broad-band reflector serving as a high reflection coating layer for reflecting light is located at the outside of the semiconductor optical amplifier, thus lowering the gain ripple generated by the coherence of light. Accordingly, the broad-band light source of the present invention eases the requirement for the reflectivity of both ends of the semiconductor optical amplifier, thus maximizing the yield of the semiconductor optical amplifier. Furthermore, the broad-band light source of the present invention may further include a polarization controller, thereby controlling the polarization dependence of the semiconductor optical amplifier.

Although only one embodiment of the present invention has been described in detail, those skilled in the art will appreciate that various modifications, additions, and substitutions to the specific elements are possible, without departing from the scope and spirit of the invention as disclosed in the accompanying claims.

What is claimed is:

1. A broad-band light source comprising:
   a semiconductor optical amplifier including an active layer serving as a gain area, an under-cladding layer and an over-cladding layer formed on the lower and the upper surfaces of the active layer, respectively, and antireflection layers formed at both ends of the active layer;
   a reflector disposed for reflecting light outputted from the semiconductor optical amplifier so that the reflected light is inputted back to the active layer, the reflector configured to minimize a gain ripple of the semiconductor optical amplifier; and
   an optical waveguide disposed between the semiconductor optical amplifier and the reflector, and configured to achieve an optical coupling between the semiconductor optical amplifier and the reflector,
   wherein the length of the optical waveguide is at least twice as much as a coherence length of an amplified spontaneous emission of the light generated from the semiconductor optical amplifier.

2. The broad-band light source as set forth in claim 1, wherein the semiconductor optical amplifier comprises one of a traveling semiconductor optical amplifier and a reflective semiconductor optical amplifier.

3. The broad-band light source as set forth in claim 1, wherein the length of the optical waveguide is 10 mm or more.

4. The broad-band light source as set forth in claim 1, wherein the reflector has a reflectivity of $1 \times 10^{-5}$ or more.

5. The broad-band light source as set forth in claim 1, further comprising a polarization controller for controlling a polarization dependence of the semiconductor optical amplifier.

6. A broad-band light source comprising:
   a semiconductor optical amplifier configured to output a light;
   a reflector for reflecting the light outputted from one end of the semiconductor optical amplifier; and
   an optical waveguide disposed between the semiconductor optical amplifier and the reflector, and configured to achieve an optical coupling between the semiconductor optical amplifier and the reflector,
   wherein the length of the optical waveguide is at least twice as much as a coherence length of an amplified spontaneous emission of the light generated from the semiconductor optical amplifier.

7. The broad-band light source as set forth in claim 6, wherein the optical amplifier further comprising an active layer serving as a gain area, an under-cladding and over-cladding layers and formed on the lower and the upper surfaces of the active layer, and antireflection coating layers at both ends of the active layer.

8. The broad-band light source as set forth in claim 6, wherein the light that is generated by the semiconductor optical amplifier and that reaches the reflector via the optical waveguide is reflected back to the active layer of the semiconductor optical amplifier.

9. The broad-band light source as set forth in claim 6, wherein the semiconductor optical amplifier comprises one of a traveling semiconductor optical amplifier and a reflective semiconductor optical amplifier.

10. The broad-band light source as set forth in claim 6, wherein the length of the optical waveguide is 10 mm or more.

11. The broad-band light source as set forth in claim 6, wherein the reflector has a reflectivity of $1 \times 10^{-5}$ or more.

12. The broad-band light source as set forth in claim 6, further comprising a polarization controller for controlling a polarization dependence of the semiconductor optical amplifier.

* * * * *